United States Patent
Suzuki et al.

(10) Patent No.: US 7,157,911 B2
(45) Date of Patent: Jan. 2, 2007

(54) RF SHIELD AND MRI SYSTEM

(75) Inventors: Tsunemoto Suzuki, Tokyo (JP); Yasushi Kato, Tokyo (JP); Nozomu Uetake, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 149 days.

(21) Appl. No.: 10/783,630

(22) Filed: Feb. 20, 2004

(65) Prior Publication Data

US 2005/0264290 A1 Dec. 1, 2005

(30) Foreign Application Priority Data

Feb. 21, 2003 (JP) .............................. 2003-043508

(51) Int. Cl.
*G01V 3/00* (2006.01)
(52) U.S. Cl. ............................ 324/318; 324/309
(58) Field of Classification Search ............... 324/318, 324/322
See application file for complete search history.

(56) References Cited

U.S. PATENT DOCUMENTS

| | | | |
|---|---|---|---|
| 4,851,780 A | * | 7/1989 | Dejon et al. ................. 324/322 |
| 5,304,932 A | * | 4/1994 | Carlson ....................... 324/318 |
| 5,572,129 A | | 11/1996 | Carlson |
| 5,573,000 A | | 11/1996 | Goffer et al. |
| 5,592,087 A | * | 1/1997 | Richard et al. .............. 324/318 |
| 6,437,567 B1 | | 8/2002 | Schenck et al. |

FOREIGN PATENT DOCUMENTS

| | | |
|---|---|---|
| JP | 08-252234 | 10/1996 |
| JP | 2000-333929 | 12/2000 |

OTHER PUBLICATIONS

European Search Report; Munich; Apr. 8, 2005; Application No. EP04 25 0882; 2 pgs.
Mori et al.; "Recent Problems of Electromagnetic Technology in MRI"; 2334b IEICE Transactions on Communications E78-B Jun. 1995, No. 6, Tokyo JP; pp. 809-817.

* cited by examiner

*Primary Examiner*—Brij B. Shrivastav
(74) *Attorney, Agent, or Firm*—Carl B. Horton, Esq.; Armstrong Teasdale LLP

(57) ABSTRACT

An eddy current induced in an RF shield by an X-axis gradient coil, a Y-axis gradient coil, and a Z-axis gradient coil respectively is homogeneously released to an earth ground simultaneously with induction. An RF shield is connected to a magnet via capacitors at four points whose angles are different from one another by 90°. The magnet is connected to the earth ground. An eddy current induced in the RF shield can be prevented from degrading MRI image quality.

11 Claims, 2 Drawing Sheets

RF SHIELD AND MRI SYSTEM

CROSS REFERENCE TO RELATED APPLICATIONS

This application claims the benefit of Japanese Application No. 2003-043508 filed Feb. 21, 2003.

BACKGROUND OF THE INVENTION

The present invention relates to a radio-frequency (RF) shield for magnetic resonance imaging (MRI) systems and an MRI system. More particularly, the present invention relates to an RF shield capable of preventing degradation in MRI image quality caused by an eddy current included in the RF shield, and an MRI system employing the RF shield.

An MRI system has an RF shield interposed between an RF coil and gradient coils for the purpose of preventing the coupling among the RF coil and gradient coils. However, an eddy current deriving from a magnetic field gradient is induced in the RF shield, which degrades the MRI image quality.

In the past, the RF shield has been divided into portions in efforts to minimize the adverse effect of the eddy current (refer to, for example, Patent Document 1).

Moreover, deformation of the RF shield is prevented for fear that an asymmetric eddy current may be induced (refer to, for example, Patent Document 2).

[Patent Document 1]
Japanese Unexamined Patent Application Publication No. Hei 8-252234

[Patent Document 2]
Japanese Unexamined Patent Application Publication No. 2000-333929

When an RF shield is grounded, the properties of an RF coil can be stabilized.

However, the geometric arrangements of an X-axis gradient coil, a Y-axis gradient coil, and a Z-axis gradient coil relative to the RF shield are different from one another. Therefore, an eddy current induced in the RF shield is different among the X-axis gradient coil, Y-axis gradient coil, and Z-axis gradient coil. If the RF shield is merely grounded, the eddy current cannot be released homogeneously. This leads to degradation in MRI image quality.

SUMMARY OF THE INVENTION

Therefore, an object of the present invention is to provide an RF shield capable of preventing an eddy current induced in the RF shield from degrading MRI image quality, and an MRI system employing the RF shield.

According to the first aspect of the present invention, there is provided an RF shield for MRI systems that is grounded via a capacitor.

Among the constituent features, the capacitor must offer a low impedance relative to a high-frequency current.

According to the first aspect, an RF shield is not directly grounded but is grounded via a capacitor. The difference of a position in the RF shield from other position therein is absorbed with an impedance offered at the capacitor. Consequently, an eddy current induced in the RF shield by an X-axis gradient coil, a Y-axis gradient coil, and a Z-axis gradient coil respectively can be homogeneously released. Eventually, the eddy current induced in the RF shield is prevented from degrading the MRI image quality.

According to the second aspect of the present invention, there is provided an RF shield for MRI systems. Herein, the RF shield is grounded at two or more points via capacitors having the same capacitance.

According to the second aspect, an RF shield is not directly grounded but is grounded via capacitors. The difference of a position in the RF shield from other position therein is absorbed with an impedance offered at a capacitor. Moreover, since the RF shield is grounded at two or more points via the capacitors, the difference of a position in the RF shield from other position therein becomes ignorable. Consequently, an eddy current induced in the RF shield by an X-axis gradient coil, a Y-axis gradient coil, and a Z-axis gradient coil respectively can be homogeneously released. Eventually, the eddy current induced in the RF shield is prevented from degrading the MRI image quality.

Moreover, since the capacitors having the same capacitance are employed, manufacture and maintenance are easy.

According to the third aspect of the present invention, there is provided an RF shield for MRI systems. Herein, the RF shield is grounded at two or more points via capacitors independently selected based on capacitances thereof.

According to the third aspect, an RF shield is not directly grounded but is grounded via capacitors. Therefore, the difference of a position in the RF shield from other position therein is absorbed with the impedance offered at a capacitor. Moreover, the RF shield is grounded at two or more points via the capacitors, and each of the capacitors is selected based on the capacitance thereof in consideration of the position of a ground in the RF shield. Consequently, the difference of a position in the RF shield from other position therein becomes ignorable. Therefore, an eddy current induced in the RF shield by an X-axis gradient coil, a Y-axis gradient coil, and a Z-axis gradient coil respectively can be homogeneously released. Eventually, the eddy current induced in the RF shield is prevented from degrading the MRI image quality.

According to the fourth aspect of the present invention, an RF shield has the same constituent features as the foregoing one. Herein, a capacitance of a capacitor connected to a ground closest to the earth ground is set to the smallest value.

According to the third aspect, the capacitance of a capacitor connected to a ground closest to the earth ground is set to the smallest value. The impedance to be offered along a grounding connection including the closest ground is therefore set to the largest value. Consequently, the difference from the impedance offered along a grounding connection including a ground farthest from the earth ground becomes small. This means that the difference of a position in the RF shield from other positions therein becomes ignorable. Consequently, an eddy current induced in the RF shield by an X-axis gradient coil, a Y-axis gradient coil, and a Z-axis gradient coil respectively can be homogeneously released. Eventually, the eddy current induced in the RF shield is prevented from degrading the MRI image quality.

According to the fifth aspect of the present invention, there is provided an RF shield for vertical field-type MRI systems. Herein, an upper RF shield is grounded via capacitors at four or more points whose directions are different from one another by an equal angle. A lower RF shield is grounded via capacitors at four or more points whose directions are different from one another by an equal angle.

According to the fifth aspect, upper and lower RF shields are not directly grounded but are grounded via capacitors. The difference of a position in each RF shield from other positions therein is absorbed with the impedances offered at a capacitor. Moreover, each RF shield is grounded via capacitors at four or more points whose directions are different from one another by an equal angle. Consequently, the difference of a position in each RF shield from other position therein becomes ignorable. Eventually, an eddy current induced in the RF shield by an X-axis gradient coil, a Y-axis gradient coil, and a Z-axis gradient coil respectively can be homogeneously released. Eventually, the eddy current induced in the RF shield is prevented from degrading the MRI image quality.

According to the sixth aspect of the present invention, there is provided an RF shield for vertical field-type MRI systems. Herein, an upper RF shield is connected via a capacitor to a grounded upper magnet or pole piece or a grounded housing of the upper magnet or pole piece. A lower RF shield is connected via a capacitor to a grounded lower magnet or pole piece or a grounded housing of the lower magnet or pole piece.

According to the sixth aspect, upper and lower RF shields are not directly grounded but are grounded via capacitors. Therefore, the difference of a position in each RF shield from other position therein is absorbed with the impedance offered at a capacitor. Consequently, the difference of a position in each RF shield from other position therein becomes ignorable. Eventually, an eddy current induced in the RF shield by an X-axis gradient coil, a Y-axis gradient coil, and a Z-axis gradient coil respectively can be homogeneously released. Eventually, the eddy current induced in the RF shield is prevented from degrading the MRI image quality. Moreover, since each RF shield is connected to the closest magnet or pole piece or the closest housing of the magnet or pole piece, wiring may be small in scale.

According to the seventh aspect of the present invention, there is provided an RF shield for vertical field-type MRI systems. Herein, the RF shield is connected to a grounded support column via a capacitor.

According to the seventh aspect, an RF shield is not directly grounded but is grounded via a capacitor. Therefore, the difference of a position in the RF shield from other positions therein is absorbed with the impedance offered at a capacitor. Consequently, the difference of a position in the RF shield from other position therein becomes ignorable. Eventually, an eddy current induced in the RF shield by an X-axis gradient coil, a Y-axis gradient coil, and a Z-axis gradient coil respectively can be homogeneously released. Eventually, the eddy current induced in the RF shield is prevented from degrading the MRI image quality. Since an RF shield is connected to the closest support column, wiring may be small in scale.

According to the eighth aspect of the present invention, an RF shield has the same constituent features as the foregoing one. Herein, a capacitance of a capacitor is 1000 pF or more.

According to the eighth aspect, an impedance offered relative to an eddy current of, for example, 10 kHz included in an RF shield is 160 Ω or less.

According to the ninth aspect of the present invention, an RF shield is grounded via a capacitor.

An MRI system in accordance with the ninth aspect employs an RF shield in accordance with the first aspect. Consequently, an eddy current induced in an RF shield is prevented from degrading MRI image quality.

According to the tenth aspect of the present invention, an RF shield is grounded at two or more points via capacitors having the same capacitance.

An MRI system in accordance with the tenth aspect employs an RF shield in accordance with the second aspect. Consequently, an eddy current induced in an RF shield is prevented from degrading MRI image quality.

According to the eleventh aspect of the present invention, there is provided an MRI system in which an RF shield is grounded at two or more points via capacitors independently selected based on capacitances thereof.

An MRI system in accordance with the eleventh aspect employs an RF shield in accordance with the third aspect. Consequently, an eddy current induced in an RF shield is prevented from degrading MRI image quality.

According to the twelfth aspect of the present invention, an MRI system has the same constituent features as the foregoing one. Herein, a capacitance of a capacitor connected to a ground closest to the earth ground is set to the smallest value.

The MRI system in accordance with the twelfth aspect employs an RF shield in accordance with the fourth aspect. Consequently, an eddy current induced in an RF shield is prevented from degrading MRI image quality.

According to the thirteenth aspect of the present invention, there is provided a vertical field-type MRI system. Herein, an upper RF shield is grounded via capacitors at four or more points whose directions are different from one another by an equal angle. A lower RF shield is grounded via capacitors at four or more points whose directions are different from one another by an equal angle.

The MRI system in accordance with the thirteenth aspect employs an RF shield in accordance with the fifth aspect. Consequently, an eddy current induced in an RF shield is prevented from degrading MRI image quality.

According to the fourteenth aspect of the present invention, there is provided a vertical field-type MRI system. Herein, an upper RF shield is connected via a capacitor to a grounded upper magnet or pole piece or a grounded housing of the upper magnet or pole piece. A lower RF shield is connected via a capacitor to a grounded lower magnet or pole piece or a grounded housing of the magnet or pole piece.

The MRI system in accordance with the fourteenth aspect employs an RF shield in accordance with the sixth aspect. Consequently, an eddy current induced in an RF shield is prevented from degrading MRI image quality.

According to the fifteenth aspect of the present invention, there is provided a vertical field-type MRI system. Herein, an RF shield is connected to a grounded support column via a capacitor.

The MRI system in accordance with the fifteenth aspect employs an RF shield in accordance with the seventh aspect. Consequently, an eddy current induced in an RF shield is prevented from degrading MRI image quality.

According to the sixteenth aspect of the present invention, an MRI system has the same constituent features as the foregoing one. Herein, a capacitance of a capacitor is 1000 pF or more.

The MRI system in accordance with the sixteenth aspect employs an RF shield in accordance with the eighth aspect. Consequently, an eddy current induced in an RF shield is prevented from degrading MRI image quality.

According to an RF shield and an MRI system to which the present invention is adapted, an eddy current induced in an RF shield by an X-axis gradient coil, a Y-axis gradient coil, and a Z-axis gradient coil respectively can be homogeneously released to the earth ground simultaneously with the induction. Consequently, the eddy current induced in the RF shield is prevented from degrading MRI image quality.

Further objects and advantages of the present invention will be apparent from the following description of the preferred embodiments of the invention as illustrated in the accompanying drawings.

DETAILED DESCRIPTION OF THE INVENTION

The present invention will be detailed in relation to illustrated embodiments below.

First Embodiment

Figure 1:
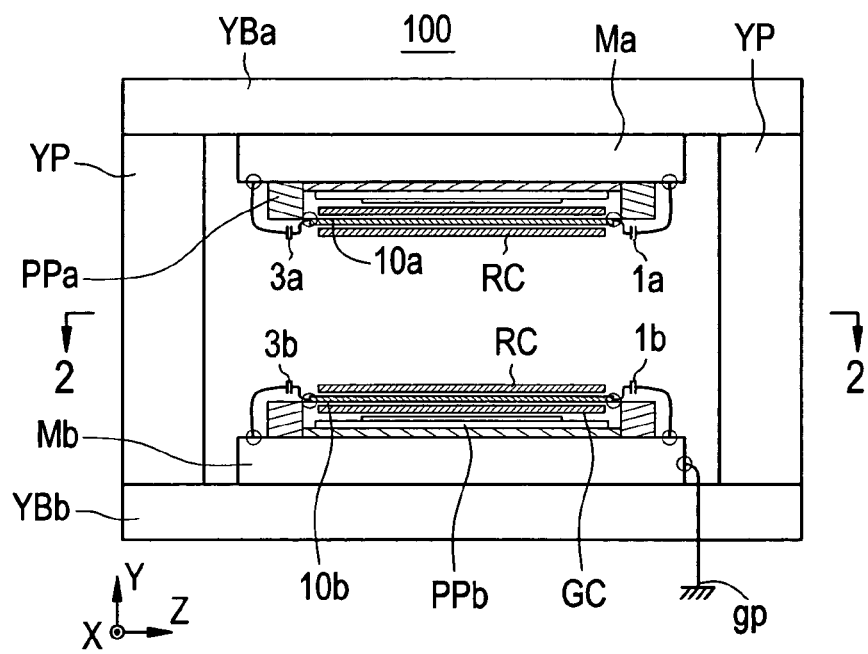
FIG. 1 is a side view showing an MRI system in accordance with a first embodiment.
Figure 2:
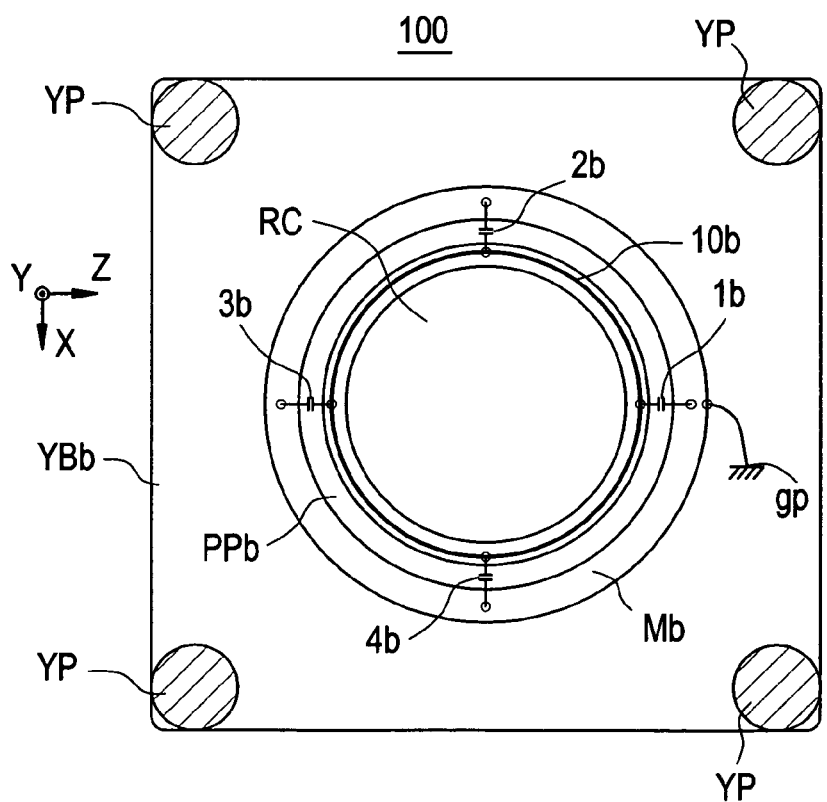
FIG. 2 is an A–A' sectional view of the MRI system shown in FIG. 1.

FIG. 1 is a side view showing an MRI system 100 in accordance with a first embodiment of the present invention. FIG. 2 is an A–A' sectional view of the MRI system shown in FIG. 1.

The MRI system 100 is an open MRI system. Herein, a magnetic circuit comprising magnets Ma and Mb that are vertically opposed to each other, base yokes YBa and YBb, support yokes YP, and pole pieces PPa and PPb is used to induce a static magnetic field in a vertical direction between the pole pieces PPa and PPb.

Gradient coils (containing an X axis, a Y axis, and a Z axis respectively) GC, a copper-foiled RF shield 10a, and an RF coil RC are layered on the lower side of the upper pole piece PPa.

Moreover, gradient coils (containing an X axis, a Y axis, and a Z axis respectively) GC, a copper-foiled RF shield 10b, and an RF coil RC are layered on the upper side of the lower pole piece PPb.

The lower magnet Mb is connected at one point to the earth ground gp. Consequently, the lower base yoke YBb, support yokes YP, upper base yoke YBa, and upper magnet Ma that are electrically connected to the lower magnet Mb are grounded.

Incidentally, the earth ground gp is a conceptual point but does not indicate an actual place.

The upper RF shield 10a is connected to the upper magnet Ma via capacitors 1a, 2a, 3a, and 4a (capacitors 2a and 4a are not shown in FIG. 1) at four points whose angles are different from one another by 90°.

The lower RF shield 10b is connected to the lower magnet Mb via capacitors 1b, 2b, 3b, and 4b at four points whose angles are different from one another by 90°.

Figure 3:
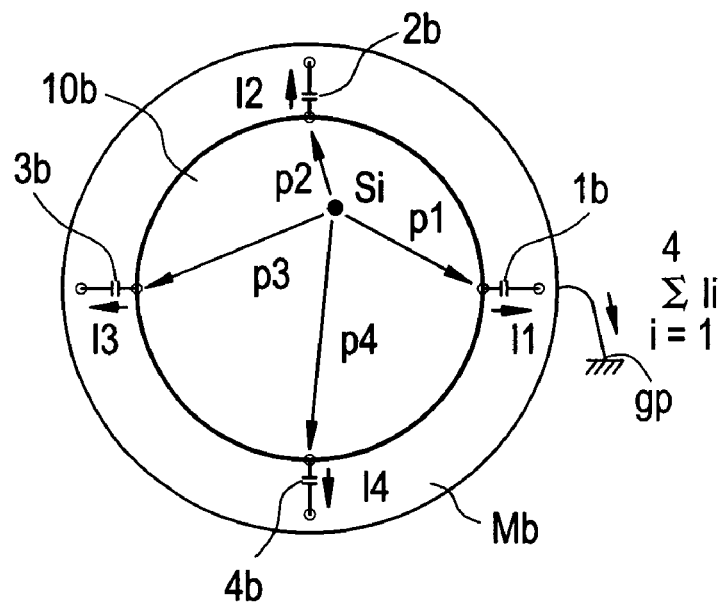
FIG. 3 is an explanatory diagram showing grounds in an RF shield in accordance with the first embodiment.

FIG. 3 is an explanatory diagram showing a state in which an eddy current induced in a place Si in the lower RF shield 10b due to a magnetic field gradient is released to the earth ground gp via the capacitors 1b, 2b, 3b, and 4b.

The frequency of an eddy current is, for example, 10 kHz, and the capacitance of the capacitors 1b, 2b, 3b, and 4b is, for example, 1000 pF. In this case, the impedance offered at the respective capacitors 1b, 2b, 3b, and 4b is approximately 160 Ω. This impedance is much higher than impedances offered to the current flows p1, p2, p3, and p4 from the place Si to the respective capacitors 1b, 2b, 3b, and 4b. The difference of the impedance offered to any of the current flows p1, p2, p3, and p4 from the impedance offered to other current flow is absorbed with the impedance offered at each of the capacitors 1b, 2b, 3b, and 4b. Consequently, currents I1, I2, I3, and I4 flowing through the capacitors 1b, 2b, 3b, and 4b respectively are equal to one another. In other words, an eddy current induced in any place in the RF shield 10b can be homogeneously released to the earth ground gp.

In short, even an eddy current induced in an inhomogeneous manner in the RF shield 10b by an X-axis gradient coil, a Y-axis gradient coil, and a Z-axis gradient coil respectively can be homogeneously released to the earth ground gp. Moreover, even an eddy current induced in an inhomogeneous manner in the upper RF shield 10a can be homogeneously released to the earth ground gp.

According to the MRI system 100, an eddy current induced in each of the RF shields 10a and 10b can be homogeneously released to the earth ground gp. Consequently, degradation in MRI image quality deriving from the adverse effect of an eddy current can be prevented.

Second Embodiment

Figure 4:
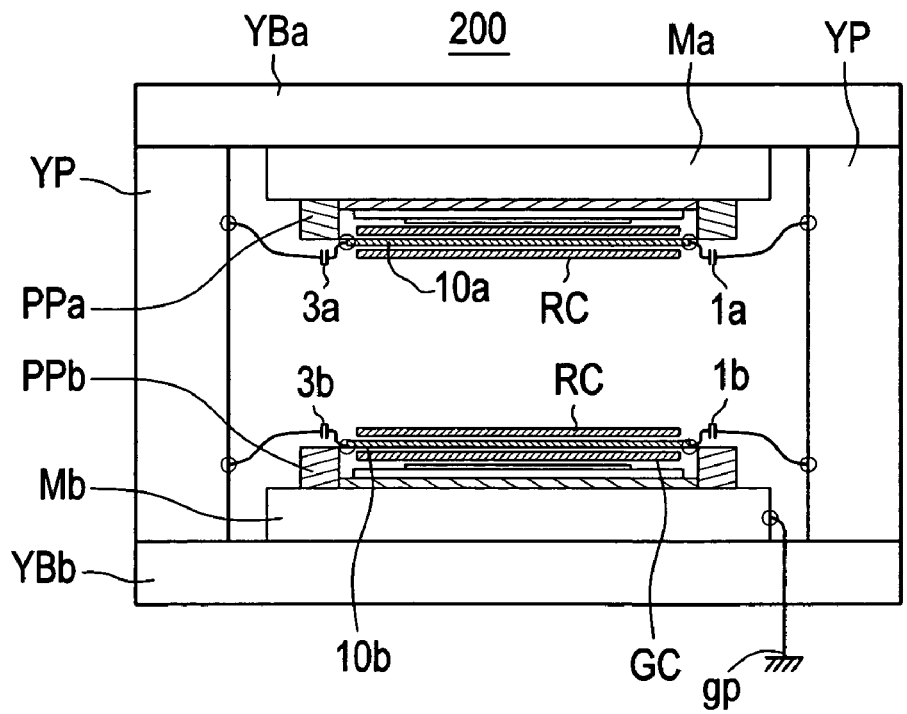
FIG. 4 is a side view showing an MRI system in accordance with a second embodiment.

FIG. 4 is a side view showing an MRI system 200 in accordance with a second embodiment.

In the MRI system 200, the upper RF shield 10a is connected to the support yokes YP via the capacitors 1a, 2a, 3a, and 4a (capacitors 2a and 4a are not shown in FIG. 4) at four points whose angles are different from one another by 90°. Moreover, the lower RF shield 10b is connected to the support yokes YP via the capacitors 1b, 2b, 3b, and 4b (capacitors 2b and 4b are not shown in FIG. 4) at four points whose angles are different from one another by 90°.

According to the MRI system 200, an eddy current induced in each of the RF shields 10a and 10b can be homogeneously released to the earth ground gp. Consequently, degradation in MRI image quality deriving from the adverse effect of an eddy current can be prevented.

Third Embodiment

The upper RF shield 10a may be connected to the housing of the upper magnet Ma, the pole piece PPa, or the housing of the pole piece PPa via a capacitor. Likewise, the lower RF shield 10b may be connected to the housing of the lower magnet Mb, the pole piece PPb, or the housing of the pole piece PPb via a capacitor.

Fourth Embodiment

The number of capacitors via which an RF shield is grounded may be one or more. For example, an RF shield may be grounded via six capacitors at six points whose angles are different from one another by 60°.

Fifth Embodiment

When two or more capacitors are employed, the capacitances of the capacitors may not be equal to one another but may be different from one another.

When the capacitances of all capacitors are made equal to one another, each of the capacitances should be determined so that the difference of an impedance offered to the current flow from each capacitor to the earth ground gp from other impedance can be absorbed with an impedance offered at the capacitor. Normally, the capacitance of a capacitor is about 1000 pF.

When the capacitances of capacitors are differentiated from one another, each of the capacitances should be determined so that the difference of an impedance, which is offered along a grounding connection from a node between an RF shield and each capacitor to the earth ground, from other impedance can be minimized. Normally, the capacitance of a capacitor connected to a ground closest to the earth ground gp is set to the smallest value, and the capacitance of a capacitor connected to a ground farthest from the earth ground gp is set to the largest value. Normally, the capacitance of a capacitor may be larger than 1000 pF.

Other Embodiments (1) The present invention can be adapted to a superconducting MRI system.

(2) The present invention can be adapted to a horizontal field-type MRI system.

What is claimed is:

1. A vertical field-type MRI system, comprising:
   a first set of capacitors;
   a second set of capacitors;
   an upper RF shield is grounded via said capacitors within said first set at four or more points whose directions are different from one another by an equal angle, wherein said capacitors within said first set are separate from said upper RF shield; and
   a lower RF shield is grounded via said capacitors within said second set at four or more points whose directions are different from one another by an equal angles, wherein said capacitors within said second set are separate from said lower RF shield.

2. An MRI system according to claim 1, wherein one of said capacitors within said first set has a capacitance of 1000 pF or more.

3. A magnetic resonance imaging (MRI) system comprising:
   a pole piece;
   a radio-frequency (RF) coil layered on a side of said pole piece;
   a gradient coil configured to generate a gradient field;
   an RF shield configured to prevent coupling between said RF coil and said gradient coil;
   a capacitor;
   a connector configured to connect said capacitor to said RF shield, wherein said MRI system configured to generate a vertical magnetic field, and said RF shield configured to be grounded via said capacitor.

4. An MRI system according to claim 3, wherein said capacitor is not connected to said RF shield via said RF coil.

5. An RF shield for MRI systems, said RF shield comprising a connector configured to connect a capacitor to said RF shield, wherein said RF shield is grounded via the capacitor, wherein one of the MRI systems configured to generate a vertical magnetic field, and wherein the capacitor is not connected to the RF shield via an RF coil.

6. An RF shield for MRI systems, said RF shield comprising a connector configured to connect a first capacitor to said RF shield, wherein said RF shield is grounded via the first capacitor and is configured to prevent coupling between a gradient coil and an RF coil, wherein said RF shield is separate from the first capacitor, and wherein one of the MRI systems configured to generate a vertical magnetic field.

7. An RE shield according to claim 6, wherein the first capacitor has a first capacitance, wherein said RF shield is coupled to a second capacitor having a second capacitance, wherein the second capacitor is connected to a ground closest to the earth ground, and wherein the second capacitance is set to the smallest value of the first and second capacitances.

8. An RE shield according to claim 6, wherein the first capacitor has a capacitance of 1000 pF or more.

9. An MRI system comprising:
   a first capacitor;
   a radio-frequency (RF) coil;
   a gradient coil; and
   an RF shield configured to prevent coupling between said RF coil and said gradient coil, wherein said MRI system configured to generate a vertical magnetic field, and said RF shield configured to be grounded via said first capacitor, and wherein said RF shield is separate from said first capacitor.

10. An MRI system according to claim 9, further comprising a second capacitor, wherein said first capacitor has a first capacitance and said second capacitor has a second capacitance, wherein said RF shield is coupled to said second capacitor that is connected to a ground closest to the earth ground, wherein the second capacitance is set to the smallest value of the first and second capacitances.

11. An MRI system according to claim 10, wherein the first capacitance is 1000 pF or more.

* * * * *

UNITED STATES PATENT AND TRADEMARK OFFICE
CERTIFICATE OF CORRECTION

| | |
|---|---|
| PATENT NO. | : 7,157,911 B2 |
| APPLICATION NO. | : 10/783630 |
| DATED | : January 2, 2007 |
| INVENTOR(S) | : Suzuki et al. |

It is certified that error appears in the above-identified patent and that said Letters Patent is hereby corrected as shown below:

In Claim 1, column 7, line 11, delete "system, comprising:" and insert therefor -- system comprising: --.
In Claim 1, column 7, line 21, delete "equal angles" and insert therefor -- equal angle --.
In Claim 7, column 8, line 12, delete "An RE shield" and insert therefor -- An RF shield --.
In Claim 8, column 8, line 20, delete "An RE shield" and insert therefor -- An RF shield --.

Signed and Sealed this

Sixth Day of November, 2007

JON W. DUDAS
*Director of the United States Patent and Trademark Office*